US011728806B2

(12) United States Patent
Carstensen et al.

(10) Patent No.: US 11,728,806 B2
(45) Date of Patent: Aug. 15, 2023

(54) TRANSMISSION LINE-BASED SHORT PULSE GENERATOR WITH ENERGY RECOVERY

(71) Applicant: ABB Schweiz AG, Baden (CH)

(72) Inventors: Jan Carstensen, Waldshut-Tiengen (DE); Torsten Votteler, Niederrohrdorf (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/311,515

(22) PCT Filed: Dec. 13, 2019

(86) PCT No.: PCT/EP2019/085156
§ 371 (c)(1),
(2) Date: Jun. 7, 2021

(87) PCT Pub. No.: WO2020/120764
PCT Pub. Date: Jun. 18, 2020

(65) Prior Publication Data
US 2022/0021385 A1      Jan. 20, 2022

(30) Foreign Application Priority Data
Dec. 14, 2018   (EP) .................................... 18212649

(51) Int. Cl.
*H03K 17/56*   (2006.01)
*C02F 1/30*   (2023.01)
(Continued)

(52) U.S. Cl.
CPC .............. *H03K 17/56* (2013.01); *C02F 1/30* (2013.01); *C02F 2103/008* (2013.01); *C02F 2303/04* (2013.01); *H05H 1/2406* (2013.01)

(58) Field of Classification Search
CPC .... G06F 1/10; G06F 1/04; G06F 1/08; H03K 5/135; G11C 7/22
(Continued)

(56) References Cited

U.S. PATENT DOCUMENTS 3,849,732 A   11/1974 Pezot
7,633,308 B1 * 12/2009 Sobolewski ....... G01R 31/2601
                                                         324/126
(Continued)

FOREIGN PATENT DOCUMENTS

| CN | 104836010 A | * | 8/2015 | |
| CN | 106941346 A | * | 7/2017 | ............... H03K 3/57 |
| CN | 207573260 U | * | 7/2018 | |

OTHER PUBLICATIONS

Extended European Search Report; Application No. 18212649.0; Completed: Jun. 17, 2019; dated Jul. 4, 2019; 10 Pages.
(Continued)

*Primary Examiner* — Quan Tra
*Assistant Examiner* — Anh-Quan Tra
(74) *Attorney, Agent, or Firm* — Whitmyer IP Group LLC

(57) ABSTRACT

A pulse generator and a method for generating pulses are provided. The pulse generator includes at least one first transmission line with a first and a second end; at least one second transmission line with a first and a second end; a voltage source; a switching unit; and a charge control device. The charge control device is adapted to connect an output of the voltage source to the first end of the at least one first transmission line. A first switch S1 in the switching unit is adapted to connect or disconnect the second end of the at least one first transmission line to the first end of the at least one second transmission line for predetermined time spans. A second switch S2 in the switching unit is adapted to connect or disconnect the first end of the at least one second transmission line to a fixed potential. The opening or closing
(Continued)

states of S1 and S2 in the switching unit are mutually exclusive. A second end of the at least one second transmission line is adapted to be connected to a load. The switching unit is further adapted to operate the first switch, S1, and the second switch, S2, in a predetermined order to alter a pre-charging state of the first transmission line.

21 Claims, 3 Drawing Sheets

(51) Int. Cl.
    *C02F 103/00* (2006.01)
    *H05H 1/24* (2006.01)
(58) Field of Classification Search
    USPC .......................................................... 327/291
    See application file for complete search history.

(56) References Cited

U.S. PATENT DOCUMENTS

| 2007/0159186 A1* | 7/2007 | Grund | G01R 31/2822 |
| | | | 324/678 |
| 2007/0159205 A1* | 7/2007 | Grund | G01R 31/002 |
| | | | 324/762.02 |
| 2009/0134880 A1 | 5/2009 | Grund | |
| 2009/0219038 A1 | 9/2009 | Stockinger | |

OTHER PUBLICATIONS

International Search Report and Written Opinion of the International Searching Authority; Completed: Feb. 10, 2020; dated Feb. 18, 2020; 17 Pages.

* cited by examiner

TRANSMISSION LINE-BASED SHORT PULSE GENERATOR WITH ENERGY RECOVERY

TECHNICAL FIELD

Embodiments of the present disclosure generally relate to the field of ballast water treatment. In particular, the present application relates to devices and methods for generating chemical agents for treating the ballast water.

BACKGROUND

Cruise ships, large tankers, and bulk cargo carriers use a tremendous amount of ballast water to provide moment to resist the lateral forces on the cruise, which is often taken on in the coastal waters in one region after ships discharge wastewater or unload cargo, and discharged at the next port of call, wherever more cargo is loaded.

Ballast water discharge typically contains a variety of biological materials, including plants, animals, viruses, and other microorganisms. These materials often include non-native, nuisance, exotic species that can cause extensive ecological and economic damage to aquatic ecosystems. Ballast water discharges are believed to be the leading source of invasive species in U.S. marine waters, thus posing public health and environmental risks, as well as significant economic cost to industries such as water and power utilities, commercial and recreational fisheries, agriculture, and tourism. Studies suggests that, if no action is taken on ballast water management, species invasion can propagate to any port in the world via global shipping network with an average of two intermediate stops.

Several methods for treating ballast water are known. E.g. mechanical methods like filters. Filters have the disadvantage that of the filter size for organisms is limited. is possible, that small organisms are not removed by the filter.

Physical methods or a chemical treatment are also known. A physical method is for example radiation of organisms with ultraviolet light. Ultraviolet light is a radiation which has a very small wavelength, which is extremely harmful for organisms, the shorter the wavelength becomes.

Chemical treatment, like adding e.g. chlorine or ozone ($O_3$) to the medium to be treated, is also very efficient, but in particular chlorine is extremely poisonous when inhaled and needs to be kept in specific gas tanks. Trained personal is necessary to operate such a system.

A further method for producing substances which can inactivate organisms in ballast water, is with a so-called dielectric barrier discharge (DBD) system. Dielectric barrier discharges have been applied as source for reactive chemical species for the treatment of ballast water.

Dielectric barrier discharge systems produce a plasma. The plasma is generated in the plasma reactor of the dielectric barrier discharge system. In particular, the plasma is generated in a gap between two electrodes. The gap may be partially filled with a dielectric. The dielectric may cover one or both of the electrodes. An electric pulse, which is fed into the plasma reactor generates the plasma.

The plasma generates the substances, necessary to inactivate or destroy the organisms from a fluid, preferably a gas, which flows in the gap during discharge. From e.g. oxygen ($O_2$), the plasma generator can generate ozone ($O_3$). From e.g. a mixture of $O_2$ and nitrogen ($N_2$), nitrogen oxides (NOX) can be generated. The substances are also called active species.

For a discharge barrier system, typically large surfaces in the reactor are necessary for the discharge to produce a sufficient amount of species. The plasma reactor can therefore be compared with the capacitor.

Since the surfaces can be very large, depending on the necessary amount of plasma or active species, the charging current for such systems are very high and pose a highly capacitive load for the supporting voltage generators. Compared to this, the discharge currents for producing the plasma are small.

It turned out that pulses with a high slew rate are advantageous when producing active species. Small rise times are preferable for efficient chemical processes in the discharge.

Generation of short voltage pulses with high power is often not very efficient. Especially when small rise-times are applied, matching of a power supply to such kind of load is difficult. In case the load for such circuits is not matched to the impedance of the cable, mostly a transmission line, which e.g. connects the power supply to the plasma reactor, or if the load is mainly capacitive, a considerable part of the transmitted power may be reflected back towards the source. This energy is usually lost and makes current solutions less effective.

The present application seeks to provide a solution for an improved pulse generation for plasma reactors and a way, how usually lost reflected energy can be recovered and at least partially reused.

SUMMARY

In order to address the foregoing and other potential problems, embodiments of the present disclosure propose:

In a first aspect, a pulse generator is disclosed. The pulse generator comprises at least one first transmission line with a first and a second end. The pulse generator comprises at least one second transmission line with a first and a second end.

The pulse generator further comprises a voltage source, a switching unit and a charge control device. The charge control device is adapted to connect an output of the voltage source to the first end of the at least one first transmission line.

The switching unit comprises a first switch S1. The first switch S1 in the switching unit is adapted to connect or disconnect the second end of the at least one first transmission line to the first end of the at least one second transmission line for predetermined time spans.

The switching unit comprises a second switch S1. The second switch S2 is adapted to connect or disconnect the first end of the at least one second transmission line to a fixed potential. Opening and closing states of S1 and S2 in the switching unit are mutually exclusive. A second end of the at least one second transmission line is adapted to be connected to a load.

The switching unit is adapted to operate the first switch and the second switch in a predetermined order to alter a pre-charging state of the first transmission line.

In embodiments, the switching unit is adapted to release an electric pulse, running from the second end of the first transmission line through the second transmission line into the load; wherein at least a part of said electric pulse is reflected towards the voltage source, wherein the switching unit is further adapted such that, by operating the first switch S1 and/or the second switch S2 in a predetermined order, at least a part of the reflected part of the electric pulse pre-charges the at least first transmission line.

A fixed potential may be understood as a potential to which voltage levels are related. In particular, a "ground potential" may be considered as a "fixed potential".

In a second aspect of the present application, a method for generating pulses is disclosed. The method comprises: charging at least one first transmission line with an electric pulse at a first end; connecting, with a first switch S1, a second end of the at least one first transmission line to a first end of at least one second transmission line for a first predetermined time span; simultaneously opening a second switch S2 to disconnect the first end of the at least one second transmission line from a fixed potential; disconnecting, after a second predetermined time span, the second end of the at least one first transmission line from the first end of the at least one second transmission line by opening the first switch S1 and connecting the first end of the at least one second transmission line with the fixed potential by closing the second switch S2.

BRIEF DESCRIPTION OF DRAWINGS

Embodiments of the present disclosure will be presented in the sense of examples and their advantages may be explained in greater detail below, with reference to the accompanying drawings, wherein.

DETAILED DESCRIPTION

Figure 1:
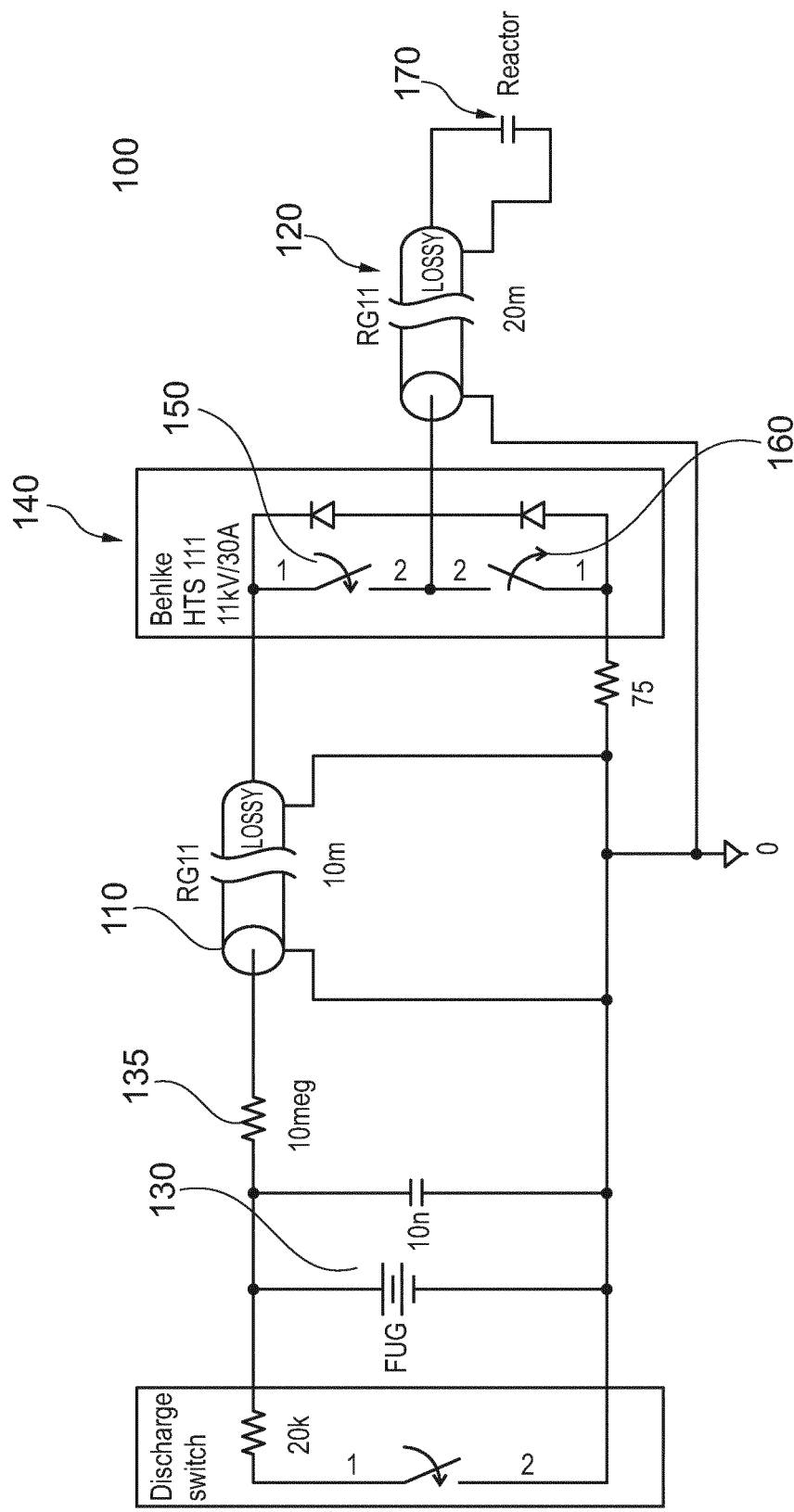
FIG. 1 shows a circuit diagram according to an embodiment of the application.

Hereinafter, the principle and spirit of the present disclosure will be described with reference to the illustrative embodiments. It should be understood, all these embodiments are given merely for the skilled in the art to better understand and further practice the present disclosure, but not for limiting the scope of the present disclosure. For example, features illustrated or described as part of one embodiment may be used with another embodiment to yield still a further embodiment. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures, systems and devices are schematically depicted in the drawings for purposes of explanation only and so as to not obscure the description with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase may be intended to have a special meaning, i.e., a meaning other than that understood by skilled artisans, such a special definition will be expressly set forth in the specification in a definitional manner that directly and unequivocally provides the special definition for the term or phrase.

A capacitive load of current DBD reactors can lead to large currents; furthermore, if the load is not matched to the impedance of the transmission line, most of the transmitted power is reflected back towards the power supply. In current solution it is attempted to match load and power supply as good as possible; losses due to the mismatch are accepted.

An arrangement for a pulse generator for a component testing unit is for example as follows: The pulse generator employs a transmission line which is charged by a MARX generator as an energy storage for a subsequent deployed pulse from a second transmission line. With these pulses, an ESD behavior of e.g. Integrated Circuits (IC) is tested. The load (e.g. the IC on a test board) is generally not matched very well to the transmission line. The ESD test pulse is partly reflected, depending on the matching. This reflected pulse however would interfere with a sent pulse and disturb the measuring at the CUT. Therefore, reflections have to be avoided with matching impedances. The reflected pulse energy is lost.

According to the present disclosure, a different concept is provided that allows to recapture at least a part of the reflected energy pulse by smart use of semiconductor switches and by storing this energy in the transmission line. For the next switching cycle, the transmission line is already pre-charged and less energy is needed for charging.

As used herein, pre-charging, or pre-charged, is typically understood as a process or a state in which an electrical energy level in the respective part is raised, compared with an initial state. For example, when the first transmission line is pre-charged, it comprises an initial energy level that is higher than in a state in which the pulse generator is not operating. The energy levels may be represented by peak voltages within the first transmission line. By way of example and not for limitation, when the pulse generator has not been operating for at least one hour, it is assumed that the initial energy level is present. In this exemplary explanation, a pre-charged state of the first transmission line is, for example, more than 500 V, more than 1 kV or more than 2 kV above the initial energy level.

A transmission line 110, used for storing energy, is charged by using a power supply 130, preferably a DC power supply.

A switch S1 150 connecting this first transmission line to a second transmission line may be switched from an open to a closed state and a substantially rectangular pulse (with a pulse length defined by the length of the first transmission line 110) travels from the first transmission line 110 to the second transmission line 120. The first transmission line is discharged.

An end of the second transmission 120 line may be connected to the load that may not be fully matched to the impedance of the transmission line. The pulse arrives at the load and its voltage is acting on the load; depending on the mismatch between load the second transmission line 120, a considerably large part of the pulse may be reflected back into the second transmission line and runs backwards towards the first transmission line 110.

As the switch S1 is still kept closed and as the impedances of the transmission lines 110, 120 are matched, the reflected pulse enters into the first transmission line without a substantial reflection.

Now, preferably at exactly the time when this pulse having the same length as the first transmission line 110 (as its length is unchanged by reflection) fills out this line, the switch S1 is opened again. Then the pulse is "captured" and the line is pre-charged with a voltage given by the average voltage of the reflected pulse. (Pulse trap)

This means that for the following pulse the DC power supply has to supply less energy than for a non-precharged transmission line and the reflected energy from the load is reused—it does not contribute to the losses of the system. As will be detailed in the description it is not necessary to exactly time the closing of the switch if diodes are used to recapture the pulse; for typical MOSFET switches such diodes are already in place.

In a first embodiment of the present application, a pulse generator may therefore be disclosed. The pulse generator may comprise at least one first transmission line 110 with a first and a second end. Further, the pulse generator may also comprise at least one second transmission 120 line with a first and a second end.

The pulse generator may further comprise a voltage source or voltage supply 130, a switching unit 140 and a charge control device 135. The charge control device 135 may further be adapted to connect an output of the voltage source 130 to the first end of the at least one first transmission line 110.

The switching unit 140 may comprise a first switch S1. The first switch S1 in the switching unit may be adapted to connect or disconnect the second end of the at least one first transmission line with the first end of the at least one second transmission line for predetermined time spans. The predetermined time spans are dependent on e.g. a transmission line length and propagation times of a pulse on the transmission line. Preferably, a length of a transmission line 110, 120 is such, that a pulse can entirely "fit" into a transmission line.

A second switch S2 in the switching unit 140 may be adapted to connect or disconnect the first end of the at least one second transmission line 120 with a fixed potential. A fixed potential can e.g. be a "ground potential". Opening and closing states of S1 and S2 in the switching unit 140 are preferably mutually exclusive. A second end of the at least one second transmission line is adapted to be connected to a load 170.

The switching unit 140 may be adapted to release an electric pulse, running from the second end of the first transmission line 110 through the second transmission line 120 into the load 170 A part of said electric pulse may be reflected towards the voltage source 130.

The switching unit 140 may further be adapted such that, by operating the switches S1 and/or S2 in a predetermined order, at least a part of the reflected part of the electric pulse pre-charges the at least first transmission line 110. Said differently, the energy that is contained in the reflected pulse (which is a fraction of the original pulse from the source 130), is now contained in the at least first transmission line 110. The level of reflection of the reflected pulse typically depends on to which extent the load 170 is matched to the second end of the at least one second transmission line 120. In other words, due to as mismatch between the second end of the at least second transmission line 120 and the load 170, a part of a pulse running into the load may be reflected.

This may increase a voltage level in the at least one first transmission line 110. Less charging from the voltage source 130 may be necessary. The previous voltage level in the at least one first transmission line 110, before pre-charging, may have been about zero volts. The voltage source 130 therefore only needs to deliver a reduced amount of energy to completely charge the at least first transmission line 110. The pulse (the energy of the pulse) which is reflected at the load (a part of the initial pulse) is re-used and increases in an advantageous manner the effectivity of the pulse generator and, as a result, the generation of active species in the DBD reactor.

Figure 2:
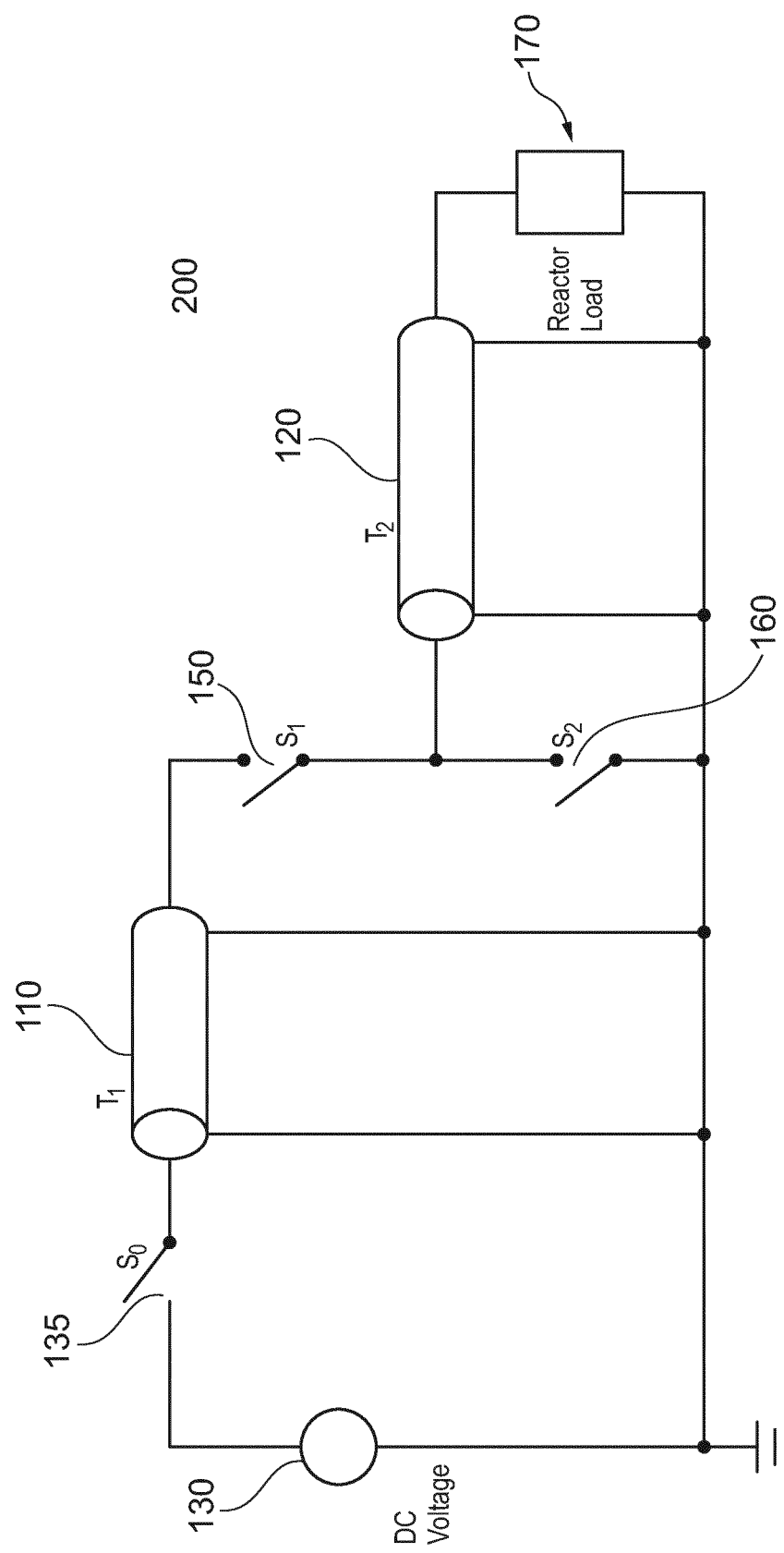
FIG. 2 shows a principle circuit diagram of an embodiment of the application.

FIG. 2 shows a principle sketch of the arrangement of this application. 130 is a DC voltage generator, capable of outputting a DC voltage. The DC voltage generator has an output, at which the DC voltage is available.

Switch 135 (S0) connects the output of the DC generator to an input (first end) of transmission line 110. When switch S0 is closed, the first transmission line is charged, similar to a capacitor. The transmission line is preferably a coaxial cable, which can be considered as a cylinder capacitor.

The transmission line 110 is charged from the DC generator and stores a specific amount of energy. This amount is dependent on geometrical characteristics of the transmission line. Some of the characteristics are length, diameter, dielectric.

If the voltage at the transmission line 110 reaches a specific level, S0 can be opened. The energy from the power supply is stored in transmission line 110 (T1). The pulse is initiated by opening S2 and closing S1. Opening and closing the switches S1/S2 is preferably simultaneously.

A pulse starts to travel out of the first transmission line 110 (T1) into second transmission line 120 (T2). Transmission line 120 may have at least the same length as transmission line 110. Impedances of the first transmission line 110 and the second transmission line 120 may be matched such that there is no reflection at their connection point.

After a certain time, a front of the pulse reaches the reactor. At this time, the end of the pulse is contained in the second transmission line 120. T1 is completely discharged at substantially voltage level 0 volt. At the reactor side, which is a mainly capacitive load, a part of the pulse is reflected and travels back towards the first transmission line 110 due to a.

When the end of the reflected pulse leaves the second transmission line 120 and enters again the first transmission line 110 (the head of the pulse then just arrives at the left/first end of T1), S1 is opened to trap the pulse and S2 is closed to "ground" the second transmission line 120 or to connect it with a fixed potential: The pulse is now captured inside T1, which is now in a "precharged" state, wherein the "precharge" is the trapped, reflected pulse.

The charging voltage in general is smaller than the voltage which originated the initial pulse—some energy has been used in the reactor. The energy stored in T1 however reduces the energy needed for fully charging transmission line 110 (T1) to the initial voltage that is supplied when S0 is closed again.

In other words, the application may ensure, that in the pulse generator, the switching unit 140 is adapted such that, by operating the switches S1 and/or S2 in a predetermined order, an energy comprised in an electrical pulse, which is reflected back from the second end of the at least one second transmission line 120 to the at least first transmission line 110, is captured in the at least first transmission line 110.

FIG. 1 shows a realization of such a system also including some variants. Instead of a switch S0, a large resistor has been used. The resistor has high resistance and may therefore act as an open switch during the pulse, but allows slow charging by voltage generator 130 (FUG). In the non-limiting example, the length of the second transmission line 120 has been chosen twice the length of the first transmission line 110.

S1 and S2 are realized by a commercially available MosFet switch. These MosFet switches may have freewheeling diodes already included, arranged parallel to each switch S1, S2.

The diodes can be used to capture the back-reflected pulse without synchronization: with the switch S1 closed during the time the pulse travels within transmission line 120. The reflected pulse may be lead via the upper diode, arranged electrically parallel to S1, back to transmission line 110.

In a non-limiting example, an on-time of the MOSFET switch is set to t=274 ns and the cable is charged to a voltage U=4.5 kV.

Figure 3:
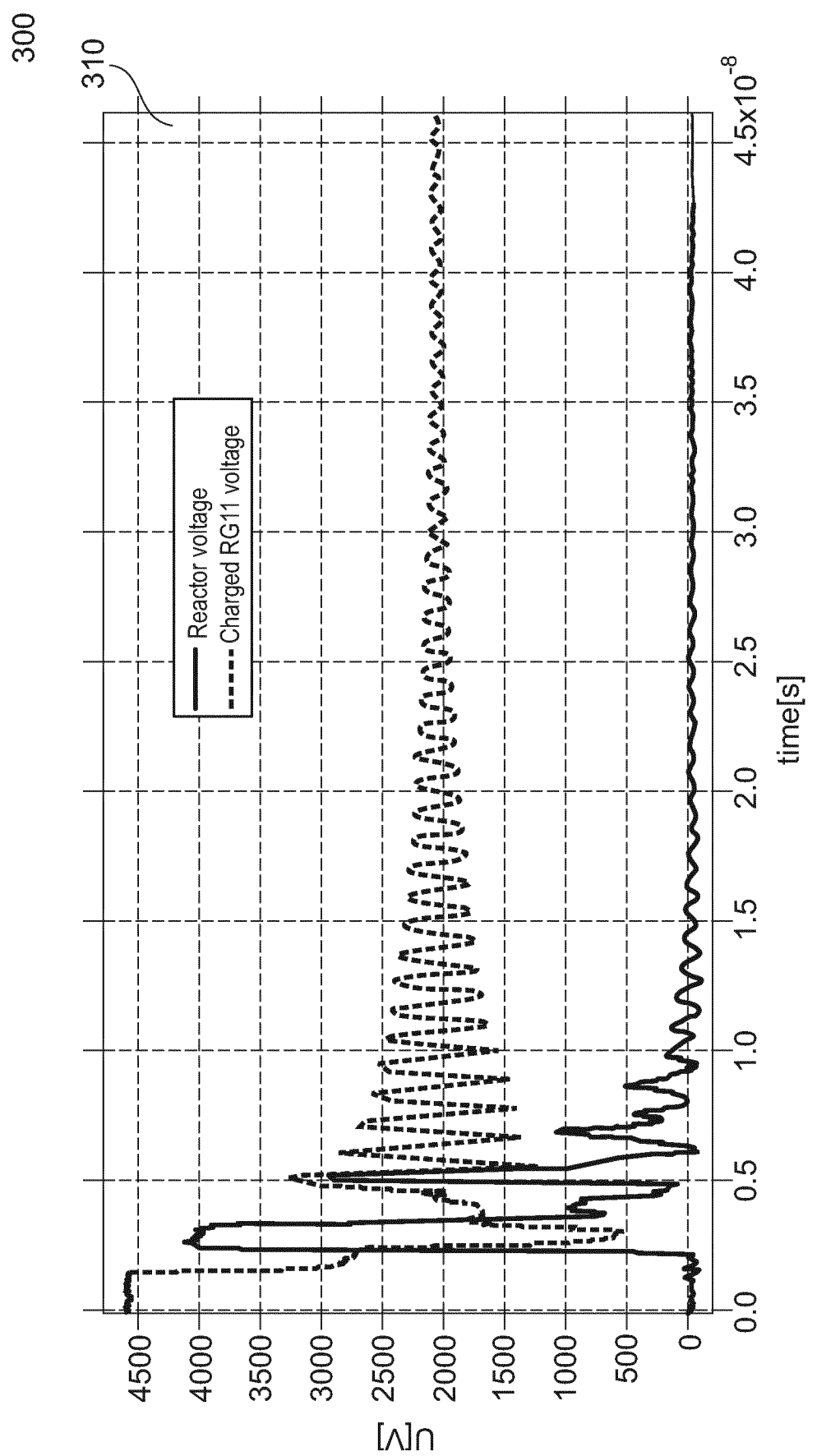
FIG. 3 shows a measurement diagram.

FIG. 3 shows the charge voltage and the pulse voltage. The pulse width is around 100 ns, the rise time of the voltage (0V to $U_{max}$) is t=30 ns. The voltage of the charged cable (first transmission line 110) drops from 4573V down to 2090V, about 21% of the energy is recovered.

Said type of switch is only exemplary. Other switching devices may also be used. The circuit according to FIG. 1 may also contain a control module (not shown here). The control module can be configured, so that it coordinates the switching process. The control module can be configured to determine the voltage at the first transmission line and is connected with the switches S1, S2.

The control module can also determine the pulse characteristics (rise time, length) and control the switches in the switching unit 140 accordingly. The control module is configured to determine, if the end of the reflected pulse has entered the first transmission line 110 and can operate switches S1/S2.

Another embodiment according to other aspects discloses a pulse generator, wherein a characteristic impedance of the at least one first transmission line 110 corresponds to a characteristic impedance of the at least one second transmission line 120. Preferably both transmission lines have a respective characteristic impedance, to avoid impulse reflections at a connection point. In particular at the connection point where the end of the first transmission line 110 connects to the input of the second transmission line 120 to avoid reflections of the pulse at this point.

Another embodiment discloses a pulse generator according to one or more aspects of the present application, wherein the at least one second transmission line 120 is longer than the at least one first transmission line 110. A longer second transmission line ensures, that the pulse length, containing the energy of the first transmission line, fits completely into the second transmission line.

Another embodiment discloses a pulse generator according to one or more aspects of the present application, wherein the charge control device 135 can be from a group: resistor, semiconductor, mechanical switch.

The actual charging of the first transmission line 110 is a substantially continuous and relatively slow process. A duty cycle of the reactor may be between 1 to 10%. This means, a voltage supply can be relatively cheap as it is more important that it supports a sufficient voltage, rather than delivering a high current.

FIG. 1 shows, that the voltage supply is connected to the first transmission line via a charge control device 135 in form of a 10 Mohm resistor. This may result in a low charging current. The resistor may enable, that the voltage supply does not have to be removed, when the pulse is triggered.

If the resistor 135 would be replaced by a switch as a charge control device, and the voltage supply would support a high charging current, the switch (S0 in FIG. 2) would have to be opened to assure, that the pulse generation is not influenced by a charging current.

Another embodiment discloses a pulse generator according to one or more aspects of the present application, wherein the first and second switch 150, 160 in the switching unit 140 comprising semiconductors and wherein the switching unit 140 is configured such, that a switching time for the first and second switch can be predetermined.

In particular, the switching unit may be controlled by a control unit. The control unit can be configured to adjust switching times of switches S1/S2.

The switching device may itself contain a control unit which can be configured to determine a charging status of the first transmission line and to coordinate the switching status and switching time of S1/S2.

Another embodiment discloses a pulse generator according to one or more aspects of the present application, wherein the transmission lines comprise coaxial cables.

Preferably the transmission lines may be realized by coaxial cables. Coaxial cables as transmission lines have the advantage that they have a defined characteristic impedance. In a specific frequency band, the resistance remains substantially resistive. The rise time of the voltage pulse is such that frequencies contained in the pulse are within this frequency band. Commercially available transmission lines (coaxial cable) have a characteristic impedance at 50 ohm or 75 ohm. These two values are just exemplary since, dependent on the geometric characteristics of the cable, also other values for a characteristic impedance is possible.

Characteristics which are relevant for the impedance are diameter or thickness of the central conductor (in case it's a coaxial cable).

In another embodiment of the present application, the shielding of the transmission lines 110, 120 can be connected with ground or a fixed potential on more than one points of the shielding. This may serve as an improved potential equalization.

Another embodiment discloses a pulse generator according to one or more aspects of the present application, further comprising a network interface for connecting the pulse generator to a data network, wherein the pulse generator is operatively connected to the network interface for at least one of carrying out a command received from the data network and sending device status information to the data network. A further embodiment may disclose a pulse generator according to one or more aspects of the present application, wherein the network interface is configured to transceive digital signal/data between the pulse generator and the data network, wherein the digital signal/data include operational command and/or information about the pulse generator or the network and further comprises a processing unit for converting the signal into a digital signal or processing the signal.

The latter embodiment may enable the DBD system to be controlled from outside. This may be necessary if, for example, the dielectric barrier discharge system is on the ship and has to be maintained.

Another embodiment discloses a method for generating pulses. The method comprising: charging an at least one first transmission line with an electric pulse at a first end;

connecting, with a switch S1 150 in a switching unit 140, a second end of the at least one first transmission line 110 with a first end of an at least one second transmission line 120 for a first predetermined time span and; substantially simultaneously opening a switch S2 160 in the switching unit 140 to disconnect the first end of the at least one second transmission line from a ground potential; disconnecting, after a second predetermined time span, the second end of the at least one first transmission line 110 from the first end of the at least one second transmission line 120 by opening switch S1 150 and connecting the first end of the at least one second transmission line 120 with the ground potential by closing switch S2 160 in the switching unit 140.

An advantage of this method is, that the voltage source does not need to deliver a high current. This is because the voltage source first has to charge the energy storage, which is provided in form of the first transmission line. Considering that in only about 1 to 10% of time a plasma is generated, the DC voltage generator has enough time to reload the energy storage.

That means it is not necessary to use a high-voltage source, which can also provide a high current, but it is sufficient, to have a not so powerful but cheaper energy source.

Another advantage is, that this method saves energy. In conventional DBD systems, the energy, reflected at the connection point of cable and reactor is lost. Therefore, the efficiency of conventional systems is quite low since these reactors have a mismatch between cable and reactor input. Inevitably, reflections of the voltage pulses occur and the energy of the reflected pulse is lost.

The reflected energy is, by proper operation of the switches, at least partially stored back in the first transmission line. This means that the energy storage will be pre-charged with the energy of the reflected pulse. The next time, the plasma reactor is activated with a voltage pulse, the energy storage, pre-charged with the reflected energy from the recent pulse, has to be charged with an amount of energy, lesser than necessary as if the energy storage would have been empty at charging start.

FIG. 1 shows an exemplary embodiment of a circuit, with which the method can be executed. Voltage generator 130 (FUG) charges the transmission line 110 with a specific electric charge. The electric charge is determined by specifications of the transmission line itself.

The electric charge is dependent on break-through voltage, which is the maximum voltage before a discharge between the conductors in the transmission line, preferably a coaxial cable, occurs. Additionally, the electric charge depends on the length of the transmission line. The longer the transmission line 110, the higher is the level of charge.

If the transmission line 110 is fully charged, which can be determined by its voltage, switch S1 is closed and S2 is opened. The complete charge moves into the second transmission line 120. This does not happen in an instantly as with a normal capacitor. The charge forms a pulse with a pulse length, propagating with a specific speed on the second transmission line 120, heading to the input of reactor 170. The propagating speed on the transmission line is also a characteristic of transmission lines.

A voltage pulse has a front and an end. The voltage pulse is entirely contained in the second transmission line. The first transmission line is uncharged. The voltage pulse further propagates on the second transmission line 120 and enters the reactor 170.

It is now assumed, that the second transmission line 120 and the reactor 170 are not matched. This means, that the characteristic impedance of the second transmission line 120 is not the same or similar to the impedance of the reactor 170. One part of the voltage pulse propagates into the reactor 170, a second part of the pulse is reflected back to the voltage generator 130.

Propagation speed of the transmission lines 110, 120 is assumed as known as well as the pulse length. From these values, it can be determined, when the end of the reflected pulse has left the first end of second transmission line 120. The pulse and its energy are now contained in first transmission line 110 and lifts the voltage level in the first transmission line 110 to a certain level which corresponds to the energy of the reflected pulse.

Transmission line 110 has now a "starting" voltage level and the voltage source only needs to charge transmission line 110 with the difference.

According to FIG. 1, it may not be necessary to close S1 when the reflected pulse travels back to the first transmission line. Even if S1 is open, the reflected pulse can travel to transmission line 110 over the free-wheeling diode, which is switched parallel to S1.

Further, features illustrated or described as part of one embodiment can be used on or in conjunction with other embodiments to yield yet a further embodiment. It is intended that the description includes such modifications and variations.

While the foregoing is directed to embodiments of the disclosure, other and further embodiments of the disclosure may be devised without departing from the basic scope thereof, and the scope thereof is determined by the claims that follow.

The invention claimed is:

1. A pulse generator for operating a plasma reactor, comprising:
   at least one first transmission line with a first and a second end;
   at least one second transmission line with a first and a second end;
   a voltage source;
   a switching unit;
   a charge control device;
   wherein,
   the charge control device is adapted to connect an output of the voltage source to the first end of the at least one first transmission line for charging the at least one first transmission line;
   a first switch in the switching unit is adapted to connect or disconnect the second end of the at least one first transmission line to the first end of the at least one second transmission line for predetermined time spans;
   a second switch in the switching unit is adapted to connect or disconnect the first end of the at least one second transmission line to a fixed potential, wherein the opening or closing states of the first switch and the second switch in the switching unit are mutually exclusive;
   the second end of the at least one second transmission line is connectable to the plasma reactor;
   the switching unit operates the first switch and the second switch in a predetermined order so that when a part of an electrical pulse is reflected at the plasma reactor back towards the at least one first transmission line, the first switch is opened to capture the reflected part in the at least one first transmission line and further the second switch is closed to connect the first end of the at least one second transmission line to the fixed potential, wherein an energy of the reflected part is used to alter a pre-charging state of the at least one first transmission line such that the voltage source is configured to deliver less energy to full charge the at least one first transmission line in the pre-charging state relative to the at least one first transmission line in a non-precharged state.

2. The pulse generator according to claim 1, wherein:
the switching unit is adapted to release the electric pulse, so that the electric pulse runs from the second and of the first transmission line through the second transmission line into the plasma reactor.

3. The pulse generator according to claim 2, wherein the switching unit closes the first switch and opens the second switch simultaneously to release the electric pulse towards the plasma reactor.

4. The pulse generator according to claim 1, wherein a characteristic impedance of the at least one first transmission line corresponds to a characteristic impedance of the at least one second transmission line.

5. The pulse generator according to claim 1, wherein the at least one second transmission line is longer than the at least one first transmission line.

6. The pulse generator according to claim 1, wherein the charge control device comprises at least one of a resistor, a semiconductor, or a mechanical switch.

7. The pulse generator according to claim 1, wherein the first and second switches in the switching unit include semiconductors; and
wherein the switching unit is configured such that a switching time for the first and second switches is predetermined.

8. The pulse generator according to claim 1, wherein the voltage source has a characteristic impedance which has a value less than three times an impedance of the at least one first transmission line.

9. The pulse generator according to claim 1, wherein the transmission lines comprise coaxial cables.

10. The pulse generator according to claim 1, wherein a shielding of the transmission lines is connected with the fixed potential.

11. The pulse generator according to claim 1, further comprising a network interface for connecting the pulse generator to a data network, wherein
the pulse generator is operatively connected to the network interface for at least one of carrying out a command received from the data network and sending device status information to the data network.

12. The pulse generator according to claim 11, wherein the network interface is configured to transceive digital signals between the pulse generator and the data network,
wherein the digital signals include the command, information about the pulse generator, and/or information about the network, and
wherein the network interface includes a processing unit for converting data into a digital signal or processing the digital signals received from the data network.

13. The pulse generator according to claim 1, wherein the plasma reactor is a capacitive load.

14. A method of generating pulses for operating a plasma reactor, comprising:
charging, via a voltage source, at least one first transmission line with an electric pulse at a first end;
connecting, with a first switch, a second end of the at least one first transmission line to a first and of at least one second transmission line for a first predetermined time span wherein a second end the of at least one second transmission line is connectable to the plasma reactor;
simultaneously opening a second switch to disconnect the first end of the at least one second transmission line from a fixed potential;
after a second predetermined time span when a part of the electrical pulse is reflected at the plasma reactor bac towards the at least one first transmission line, disconnecting the second end of the at least one first transmission line from the first and of the at least one second transmission line by opening the first switch to capture the reflected art in the at least one first transmission line, and connecting the first end of the at least one second transmission line with the fixed potential by closing the second switch;
wherein an energy of the reflected part is used to alter a pre-charging state of the at least one first transmission line such that the voltage source is configured to deliver less energy to fully charge the at least one first transmission line in the pre-charging state relative to the at least one first transmission line in a non-precharged state.

15. The pulse generator according to claim 1, wherein the switching unit is adapted to operate the first switch and the second switch such that the first switch and the second switch are each in an ON state for predetermined time periods.

16. The pulse generator according to claim 1, wherein the first switch is opened to capture the reflected part in the at least one first transmission line when a tail end of the reflected part leaves the at least one second transmission line and enters the at least one first transmission line.

17. The pulse generator according to claim 1, wherein the predetermined time spans are dependent on a transmission line length and propagation times of the electrical pulse on the transmission lines.

18. The pulse generator according to claim 1, wherein the altering of the pre-charging state of the at least one first transmission line comprises an increase in a voltage level of the at least one first transmission line.

19. The pulse generator according to claim 1, wherein the first switch and the second switch are controlled based on pulse characteristics of the electrical pulse.

20. The pulse generator according to claim 1, wherein the at least one first transmission line and the at least one second transmission line are substantially matched to each other.

21. The pulse generator according to claim 1, wherein the plasma reactor is a dielectric barrier discharge (DBD) reactor such that the second and of the at least one second transmission line is connectable to the DBD reactor.

* * * * *